(12) United States Patent
Snaider et al.

(10) Patent No.: US 12,197,205 B2
(45) Date of Patent: Jan. 14, 2025

(54) UAV GUIDANCE SYSTEM AND HAND CONTROL UNIT

(71) Applicant: The United States of America, as represented by the Secretary of the Navy, Crane, IN (US)

(72) Inventors: Jordan M. Snaider, Bloomington, IN (US); Aaron Boyd Cole, Bloomington, IN (US); Benjamin Conley, Bloomington, IN (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 316 days.

(21) Appl. No.: 17/706,941

(22) Filed: Mar. 29, 2022

(65) Prior Publication Data

US 2022/0308575 A1    Sep. 29, 2022

Related U.S. Application Data

(60) Provisional application No. 63/167,315, filed on Mar. 29, 2021.

(51) Int. Cl.
*H04B 10/116* (2013.01)
*G05D 1/00* (2006.01)
(Continued)

(52) U.S. Cl.
CPC ......... *G05D 1/0016* (2013.01); *G05D 1/0022* (2013.01); *G05D 1/104* (2013.01); *G05D 1/1064* (2019.05); *H01S 5/005* (2013.01); *H04B 10/116* (2013.01); *H04B 10/5057* (2013.01); *H04B 10/524* (2013.01); *B64U 10/14* (2023.01); *B64U 2101/15* (2023.01); *B64U 2101/30* (2023.01);
(Continued)

(58) Field of Classification Search
CPC .... G05D 1/0016; G05D 1/0022; G05D 1/104; G05D 1/1064; B64C 39/024; H01S 5/005; H04B 10/116; H04B 10/5057; H04B 10/524; H04B 10/112; B64U 2101/30; B64U 2201/102; B64U 2201/20; B64U 10/14
See application file for complete search history.

(56) References Cited

U.S. PATENT DOCUMENTS 9,874,872 B2 * 1/2018 Thörn ................. A61B 5/1112
2017/0240294 A1 * 8/2017 Chen ..................... G01S 7/499
(Continued)

*Primary Examiner* — Ashley L Redhead, Jr.
(74) *Attorney, Agent, or Firm* — Naval Surface Warfare Center, Crane Division; Patrick Law

(57) ABSTRACT

The present invention provides a system for control and guidance of an unmanned aerial vehicle (UAV) using modulated laser light in radio frequency (RF) contested environments. The system enables the user to send light signal communications to the UAV from a handheld device. In one embodiment, where the handheld device is capable of being incorporated into a firearm fore-grip with built-in controls that allow for control of the UAV by a user in a shooting/aiming position. The UAV includes an optical array for detecting and receiving the light signal communications, as well as filtering systems for filtering out unnecessary image data for better control in different weather and time conditions, as well as an avoidance system to avoid objects and other UAVs when used in a swarm of UAVs.

18 Claims, 11 Drawing Sheets

(51) Int. Cl.
   *H01S 5/00*      (2006.01)
   *H04B 10/50*     (2013.01)
   *H04B 10/524*    (2013.01)
   *B64U 10/14*         (2023.01)
   *B64U 101/15*        (2023.01)
   *B64U 101/30*        (2023.01)
   *B64U 101/64*        (2023.01)

(52) U.S. Cl.
   CPC .... *B64U 2101/64* (2023.01); *B64U 2201/102* (2023.01); *B64U 2201/20* (2023.01)

(56) References Cited

U.S. PATENT DOCUMENTS

| | | | | |
|---|---|---|---|---|
| 2017/0285627 | A1* | 10/2017 | Feldmann | G05D 1/0094 |
| 2018/0172833 | A1* | 6/2018 | Pyle | G01S 17/10 |
| 2018/0332213 | A1* | 11/2018 | Kucharski | H04N 23/661 |
| 2019/0113937 | A1* | 4/2019 | Sasaki | G05D 1/102 |
| 2020/0018571 | A1* | 1/2020 | Kang | F41J 5/08 |
| 2021/0004001 | A1* | 1/2021 | Kaneda | G08G 5/0021 |
| 2022/0013020 | A1 | 1/2022 | Guetta et al. | |
| 2022/0215657 | A1* | 7/2022 | Hiller | B64U 10/14 |
| 2023/0097676 | A1* | 3/2023 | Yap | G05D 1/027 |
| | | | | 701/2 |
| 2023/0150625 | A1* | 5/2023 | Moses | B64D 47/08 |
| | | | | 244/17.23 |
| 2023/0341875 | A1* | 10/2023 | Zhang | G05D 1/0808 |
| 2023/0399131 | A1* | 12/2023 | Zhu | B64C 27/08 |

\* cited by examiner

| | | MOVE LEFT? | MOVE RIGHT? |
|---|---|---|---|
| 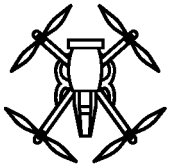 | | SEND NO SIGNAL, BECAUSE NO OBJECTS | SEND NO SIGNAL, BECAUSE OBJECT IS BELOW THRESHOLD |
| 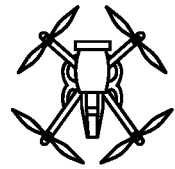 | | MOVE LEFT? YES, SOMETHING ABOVE THRESHOLD ON RIGHT, SO MOVE LEFT. | MOVE RIGHT? SEND NO SIGNAL, BECAUSE NO OBJECTS IS |
| 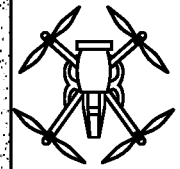 | | MOVE LEFT? NO, SOMETHING ABOVE THRESHOLD ON RIGHT, BUT OBJECT ON LEFT IS MORE INTENSE SO DO NOT MOVE LEFT. | MOVE RIGHT? YES, MOVE RIGHT BECAUSE OBJECT ON LEFT HAS A SIGNAL LEVEL GREATER THAN THE OBJECT ON THE RIGHT. |
| 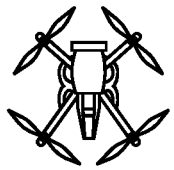 | | MOVE LEFT? TAKE NO ACTION SEND NO SIGNAL TO MOVE, BECAUSE OBJECTS ON BOTH SIDES ARE EQUALLY CLOSE. BUT MOVE WHEN IMBALANCE OCCURS. | MOVE RIGHT? TAKE NO ACTION SEND NO SIGNAL TO MOVE, BECAUSE OBJECTS ON BOTH SIDES ARE EQUALLY CLOSE. BUT MOVE WHEN IMBALANCE OCCURS. |

*FIG. 11*

UAV GUIDANCE SYSTEM AND HAND CONTROL UNIT

CROSS-REFERENCE TO RELATED APPLICATIONS

The present application claims priority to U.S. Provisional Patent Application Ser. No. 63/167,315 filed Mar. 29, 2021, and entitled "ERGONOMIC HAND CONTROL UNIT AND UAV GUIDANCE SYSTEM," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 210063US02) is assigned to the United States Government and is available for licensing for commercial purposes. Licensing and technical inquiries may be directed to the Technology Transfer Office, Naval Surface Warfare Center Crane, email: Cran_CT@navy.mil.

FIELD

The field of invention relates generally to control and/or guidance of unmanned aerial vehicles (UAVs). More particularly, the present disclosure pertains to a UAV control or guidance system using visible light in conjunction with a control unit, such as a hand control unit, to guide, direct, or control one or more UAVs.

BACKGROUND

Generally UAVs are controlled using radio frequency (RF) communications between a control unit or station and the UAV. In RF contested environments, however, RF signals may be vulnerable and a traditional RF controller in an RF communication denied environment will not function. In a war theater scenario, in particular, a warfighter requires the capability of swarming drones to overmatch and overwhelm adversary defense systems. There is currently no active emission based method to command a swarm of drones in an RF contested environment. Accordingly, there is a need for better control of UAVs in RF contested environments.

SUMMARY

The present invention provides a system with the capability to operate an unmanned aerial vehicle (UAV) in a radio frequency (RF) contested environment using light or optical control, such as with laser light. Furthermore, the system enables a user to send communications to the UAV from a control unit, such as a handheld device. In one embodiment, the handheld device is a firearm fore-grip or a rifle grip with built-in controls that allow for control of the UAV in the shooting/aiming position. One of the inventive features of the system is the ability to send signals and to control a UAV using only optical light (i.e., with no RF, Wi-Fi, Bluetooth, etc.). The present solution works by leveraging the optical properties of lasers and their interplay with available photodetectors.

BRIEF DESCRIPTION OF THE DRAWINGS

The detailed description of the drawings particularly refers to the accompanying figures in which:

FIG. 11 illustrates a table of various avoidance function for a UAV according to some examples of the present invention.

DETAILED DESCRIPTION OF THE DRAWINGS

The embodiments of the invention described herein are not intended to be exhaustive or to limit the invention to the precise forms disclosed. Rather, the embodiments selected for description have been chosen to enable one skilled in the art to practice the invention.

The presently disclosed systems and methods provide a capability to covertly operate a drone or swarm in an RF (radio frequency) contested environment using visible light, such as laser light. The laser light may be incorporated into a hand control unit operable by a user. In another example, the control unit may be mountable to another device such as a rifle (e.g., incorporated into a rifle grip). This capability enables a warfighter, for example, to send communications to a drone or swarm of drones when in a shooting/aiming position with their firearm.

Additionally, control of a drone or a swarm of drones using light signals may include sending optical command signals via a modulated laser beam. In one particular aspect, commands may be assigned to a specific frequency of light that may also be temporal in nature that constitute a code or command to direct a drone to perform various actions. In other aspects, the light may be modulated in time or pulsed sequences to communicate various commands to a drone.

Figure 1:
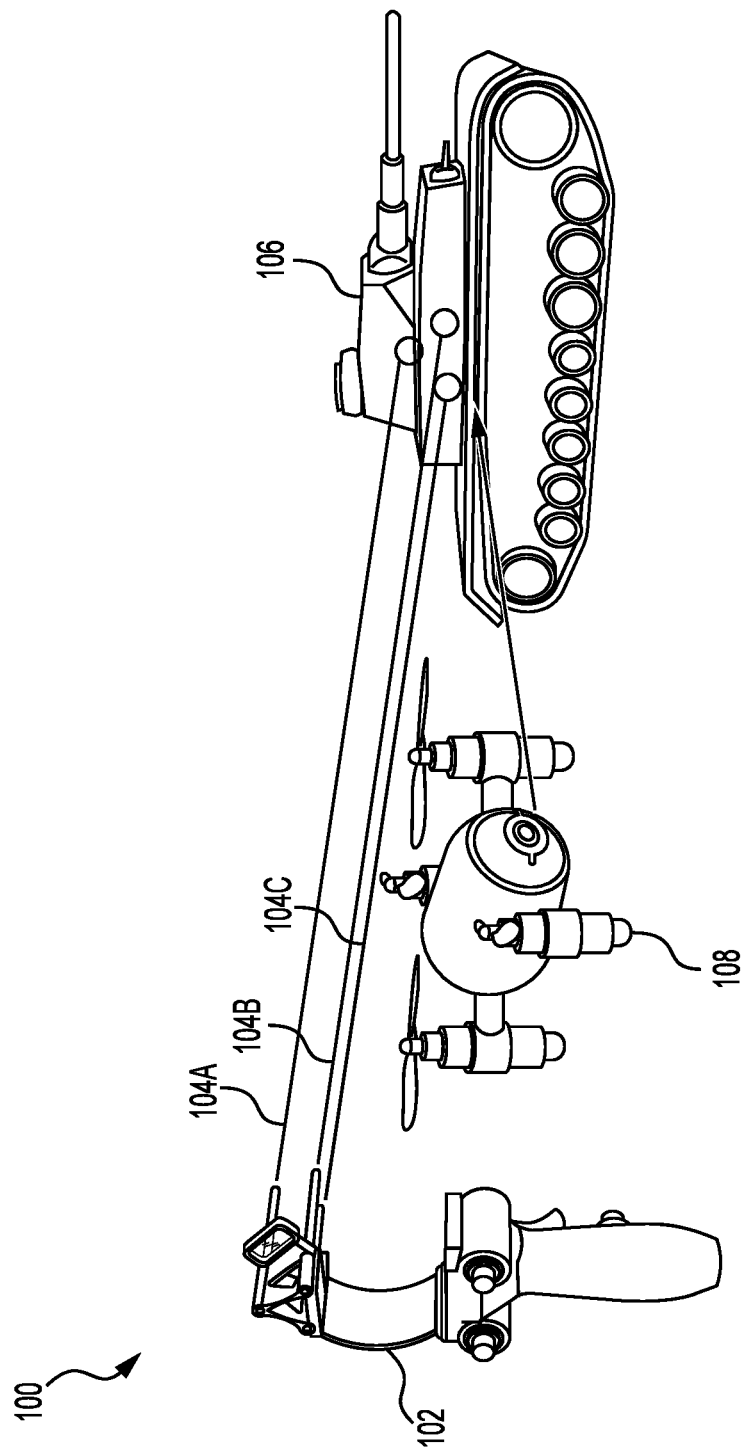
FIG. 1 shows an example of a UAV guidance system using a laser hand control unit with a three beam laser.

FIG. 1 generally illustrates a system 100 for drone guidance or control including control unit 102 with a three beam laser, but the invention is not limited to three beams and could be less or more. As illustrated, the control unit 102 is configured to emit multiple laser beams (e.g., laser beams 104a, 104b, and 104c), which may be aimed at a target 106 by hand by a user of the control unit 102. Additionally, one or more of beams 104a, 104b, and 104c may be modulated by the control unit 102 to transmit optical command signals via modulation of the laser beam, which commands an individual UAV such as drone 108 in FIG. 1 or a whole swarm of UAVs. It is noted that in some aspects the control unit 102 may be configured to be agnostic with respect to the UAV such that the control unit 102 may command various UAVs. In other aspects, users nay be assigned to a specific spectral frequency of light in the form of a temporal "code", command, or control signal to direct a specific UAV to perform one or more certain actions.

Examples of specific commands for a drone may include, but are not limited to: (1) Move to desired location/waypoint command (which may include following a laser point to a specific location); (2) Search for laser command (e.g., when the laser point is not in sight, rotate until laser point is detected); (3) Attack (i.e., home in on indicated location and may include an associated sub-command including, but not limited to: (a) deliver explosive; (b) perform counter intelligence, surveillance and reconnaissance (ISR); (c) deliver paintball or "other ballistic;" and (d) deliver "something" (e.g., ammunition, med supplies, leaflets, food, etc.); and (4) Disarm/Return to home command (e.g., abort attack call or return back to launch location).

As mentioned above, the one or more laser beams may be modulated to issue various commands, either using different light spectra and/or using timed pulses. Furthermore, in other embodiments, the commands may be encoded such that they are capable of being decoded by only those UAVs for which the commands are intended.

In particular aspects, it is noted that the control unit 102 may include within or be compatible with a laser unit and a modulation unit. In one example, the presently disclosed system is compatible with systems such as the Miniature Aiming Light (MAL) High Power (MAL-HP) or the Advanced Target Pointer Illuminator Aiming Laser (AT-PIAL—LA-5/PEQ). In an aspect, the present system can use such light systems as a light source. The ATPIAL or MAL-HP may be advantageous due to ease of integration, higher power levels, form factor, Laser Safety Review Board (LSRB) approvals, logistics support facilities, and common usage by a wide array of US forces.

Figure 2:
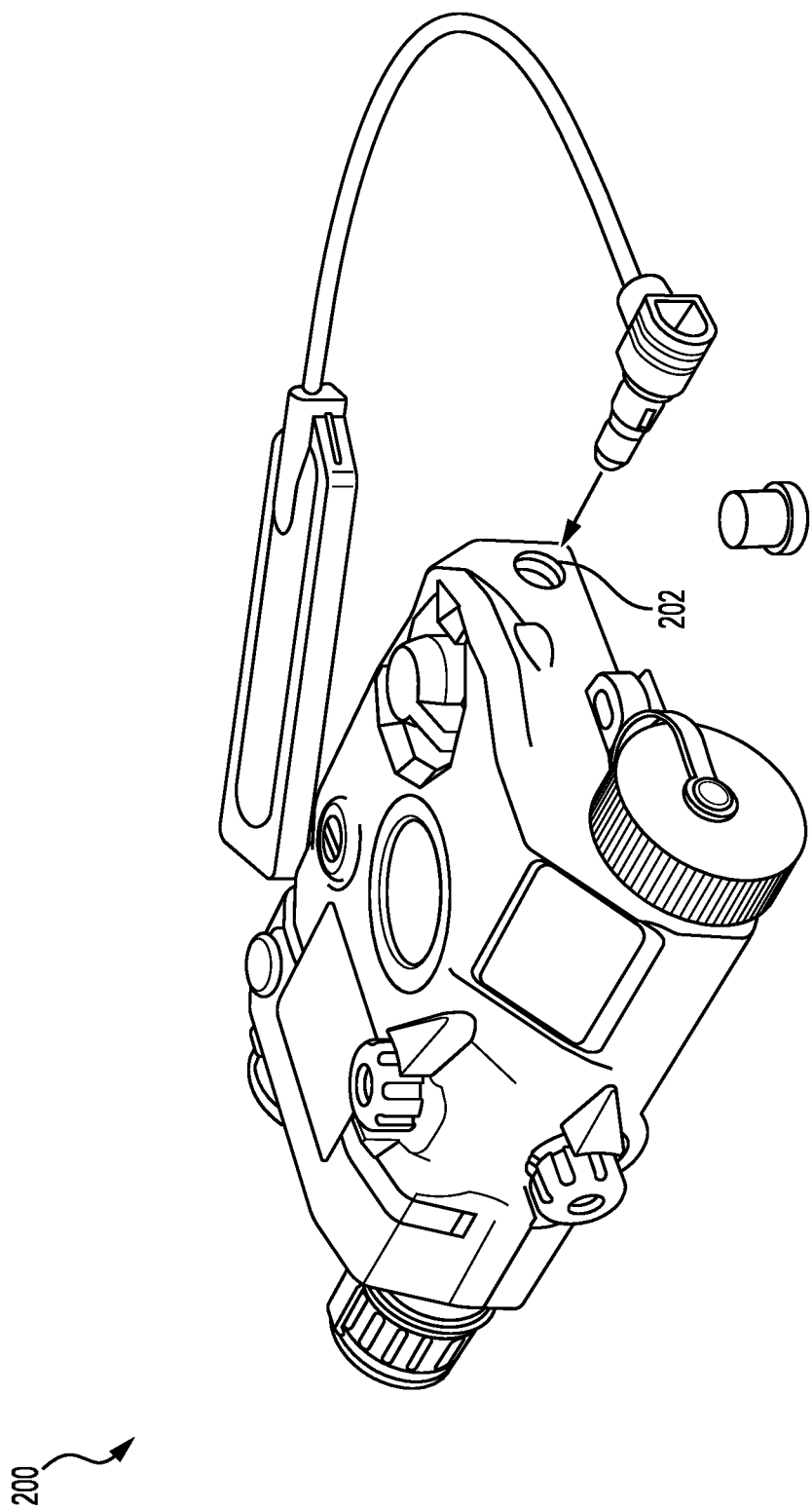
FIG. 2 shows an example of an Advanced Target Pointer Illuminator Aiming Laser (ATPIAL—LA-5/PEQ) with a modulation input port.

FIG. 2, in particular, shows an example of an Advanced Target Pointer Illuminator Aiming Laser (ATPIAL—LA-5/PEQ) 200 with a modulation input port 202. Control of the ATPIAL (or MAL-HP) may be effectuated with a controller fabricated into a handheld controller, such as a custom rifle fore-grip attachment, that inputs control signals to the input port 202. The light from the laser device such as 200 can be modulated in two different ways: 1) utilize the built-in input (e.g., 202) each already present in the laser device, or 2) a modulation technology external to the laser such as a liquid crystal shutter, an electro-chromic window, an electro-optic modulator, or the like. Both these methods can control the on and off modulation of the laser beam.

For the first method above, laser units such as ATPIAL units that already have a pulsed Near Infrared (NIR) laser that can be exploited and used for modulation signaling. To externally trigger the NIR laser in the example of ATPIAL units, one can utilize the built-in cable port (e.g., 202) already present in the ATPIAL device.

In the second method above, the control unit does not need to specifically interface with the laser device (i.e., no modulation input is delivered or sent via the cable port in the case of ATPIAL units). In this case, the control unit may include a modulator such as a liquid crystal device, electro chromic window, or an electro optic phase retarder, which can control the "on/off" frequency or duty cycle of the laser beam, and corresponds to a specific code/command. Each aforementioned technology is like a liquid crystal shutter; they are vibration insensitive, and have no moving parts. Each is able to quickly open and close (on and off) with speeds as slow as approximately 6 milliseconds or as fast as 10's of nanoseconds, and operated by applying a controlled voltage, for example. Since an external modulation window is completely removed from the laser, it works with anything visible through near infrared laser and can be used independent of a device utilizing the ATIPAL unit, such as a rifle that uses such units.

Figure 3B:
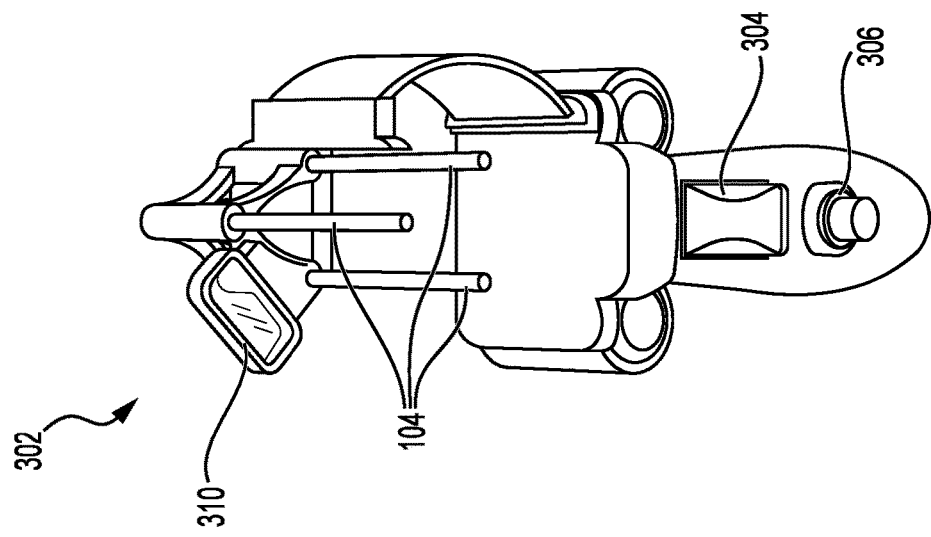
FIGS. 3A-3B shows multiple views of a rifle-mounted UAV hand control unit.
Figure 3A:
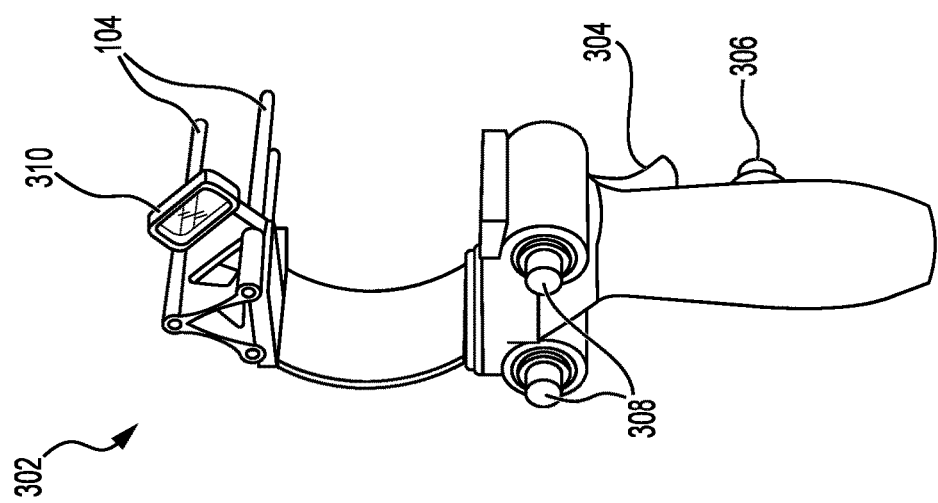

FIGS. 3A and 3B respectively show different tri-metric views of an exemplary control unit 302, which may correspond to the unit 102 illustrated in the system of FIG. 1. In the example of FIGS. 3A and 3B, the control unit 302 is configured as a rifle mounted hand control unit, but many other configurations for hand control and/or weapon mounting may be contemplated. Commands transmitted for control of the UAV are issued from the control unit via optical signals (e.g., modulated laser light beams), which may be a control unit fabricated as or within a custom rifle fore-grip attachment.

The exemplary control unit 302 shown in FIGS. 3A and 3B may include various input devices such as a trigger 304 for executing various commands to control a UAV, and side buttons 306 and/or 308 that may be used for cycling through or selecting the various triggered commands, as an example. Further, the control unit 302 may include a small LCD like screen 310 to externally modulate an outgoing ATPIAL laser (not shown). In one example, the control unit 302 may also be equipped with three low-power co-aligned red lasers, the emission of which is shown at 104. The illustrated design enables the user to aim the laser(s) towards the desired location and to send out a command of modulated light from their fingertips, including while in a comfortable shooting/aiming position if mounted to a firearm such as a rifle. Additionally, the switch 304 may be stemmed off the control unit 302. The control unit 302 may also be fabricated into or as a custom rifle fore-grip attachment as illustrated in FIGS. 3A and 3B. Moreover, the control unit 302 may include an externally mounted light modulation unit (shown at 310) that may be configured as liquid crystal, electro chromic window, or electro optic phase retarder, to control the "on/off" frequency of a laser beam and corresponding to a specific code/command. It is noted that the unit 310 is shown externally disposed on the control unit 302 in FIGS. 3A and 3B, and may control light transmissivity for modulation of an external laser device such as an ATPIAL laser (not shown). In other embodiments, the unit 310 may be configured to be selectively be placed in the path of one or more of internally generated laser beams (e.g., 104), such as through a hinge or other means allowing selective movement of the unit 310 into and out of the path of the beams.

Figure 4:
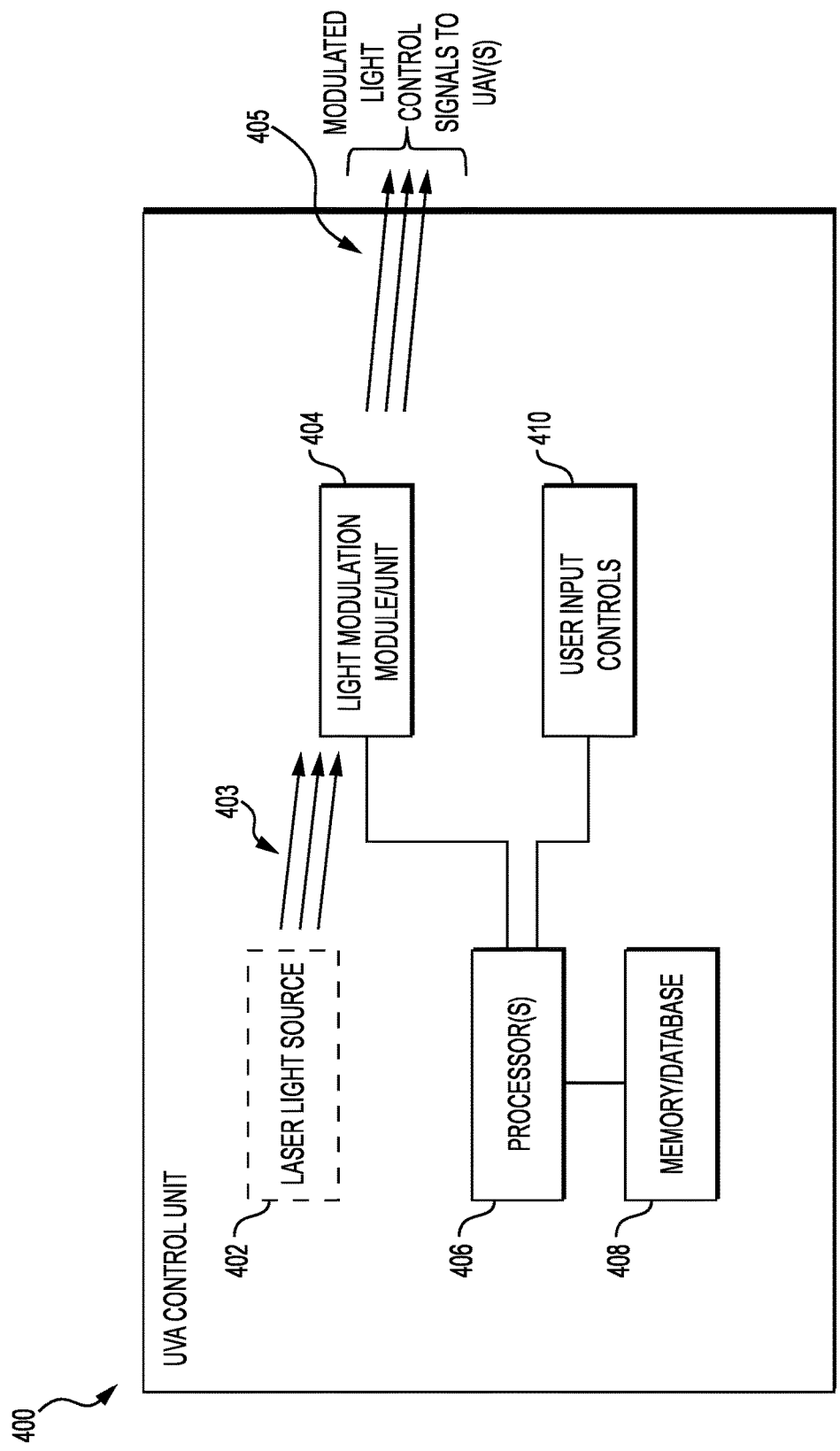
FIG. 4 illustrates a block diagram of an exemplary UAV control unit.

Each of aforementioned technologies is similar to a liquid crystal shutter, and are therefore vibration insensitive and have no moving parts. Each is able to quickly open and close its light transmissivity (on and off) with speeds as slow as ~6 milliseconds or as fast as 10's of nanoseconds by applying a controlled voltage, for example. Since the external modulation window is completely removed from the laser, it works with any visible light spectra through near infrared laser and can be used independent of the rifle, FIG. 4 illustrates a block diagram of an exemplary UAV control unit 400 usable in a UAV control system according to some aspects. As shown, the control unit 400 may include a laser light source 402, which is configured to generate at least one beam of laser light illustrated by arrows 403. It is noted that laser light source 402 is shown dashed to indicate that this source or unit 402 may be either incorporated or integrated in the control unit 400 as shown, or alternatively may be an external laser source, such as an ATPIAL laser.

The control unit 402 further includes a modulation unit or light modulator 404 configured to receive and modulate the at least one beam of laser light 403 according to at least one of one or more light frequencies or light pulses to generate one or more light control signals configured for controlling a UAV. It is noted that unit 404 may be configured as one of a liquid crystal, an electro chromic window, or an electro optic phase retarder that is configured to control the "on/off" frequency or create pulses of laser beam 403. Additionally, the unit 404 may be configured to be selectively engageable with the laser beams 403, such as through window 310 as discussed before. Since the unit 404 may, in part, be configured to control the light transmissivity, the unit 404 is also able to control transmission of the light and serves to transmit the one or more generated light control signals 405 to enable the UAV to detect and receive the one or more generated light control signals.

The control unit 400 may further include a processor 406 and an associated memory 408 in communication therewith, where the processor 406 is configured to implement computer-readable instructions stored in memory 408, including generating and controlling signals and/or voltages that are input to unit 404 for modulation of the light beam to generate the light control signals. Furthermore, control unit 400 includes one or more user input controls or devices 410 that receive user input selections of various commands for control of the UAV. The controls 410 may include any of the trigger 304 and/or selectors/toggles/joysticks 306, 308 illustrated in FIGS. 3A and 3B.

Figure 5:
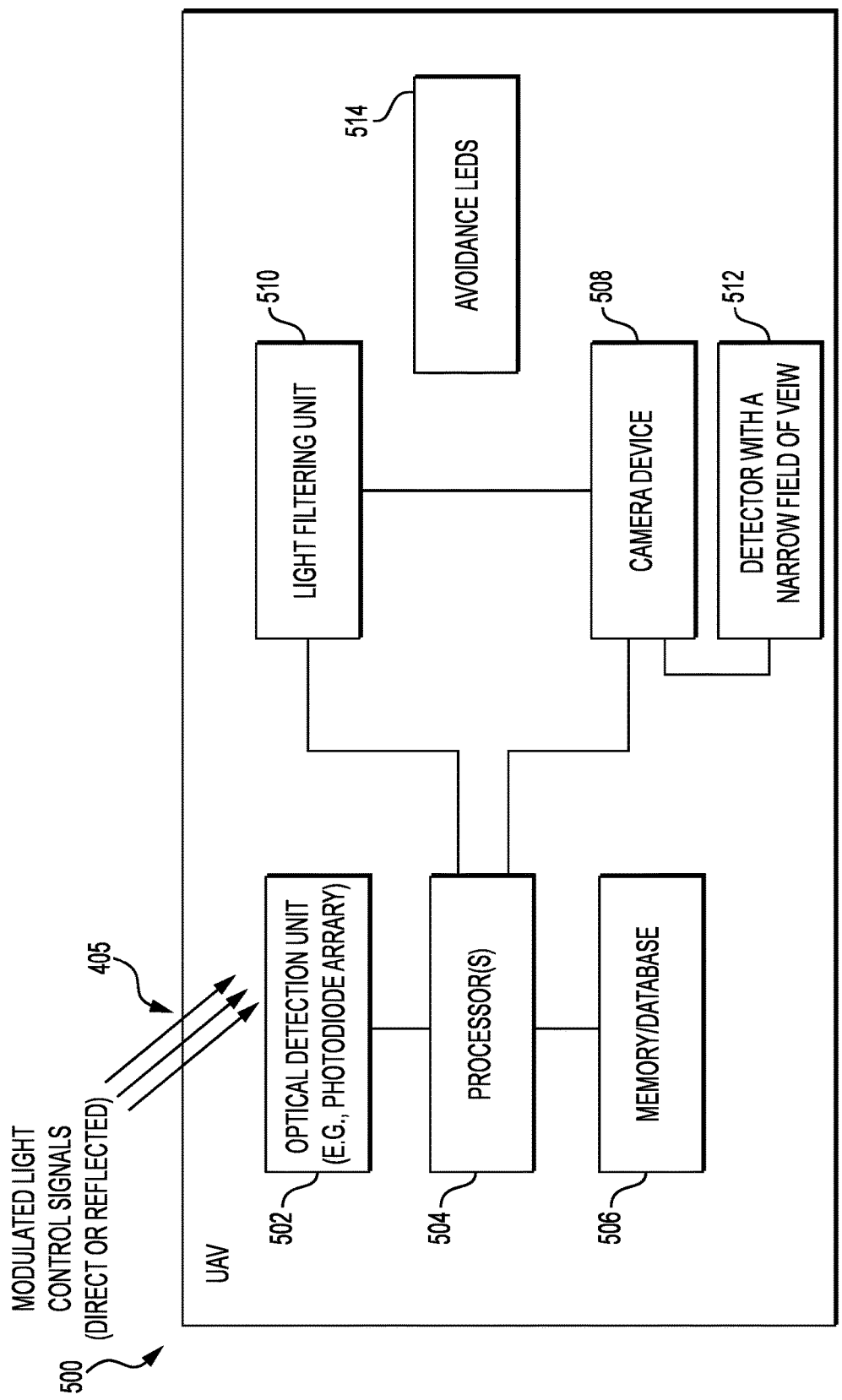
FIG. 5 illustrates a block diagram of an exemplary UAV that may be controlled by the control unit of FIGS. 1-4 according to some examples.

On the receiving end of the light signal communications, an exemplary UAV 500 usable in the system is illustrated in FIG. 5. The UAV 500 includes an optical detection unit 502, which receives and detects the light command signals 405 from the control unit 400. In an embodiment, the unit 502 may be a photodiode array mounted to the bottom of the UAV. The photodiode array may consist of multiple photodiodes arranged in a hemispherical viewing pattern and mounted on the bottom of the UAV, which provide omnidirectional sensing. This omnidirectional sensing array enables the UAV to view approximately a full 2π steradians below and around the bottom and the front, back, and sides of the UAV (i.e., approximately a hemisphere of view). Additionally, the signal strength off each diode in parallel will enable the UAV to find and orient itself in the right direction using a simple feedback algorithm, such as a PID loop.

The UAV 500 may also include an on-board processor 504 and associated memory 506 configured to store computer readable instructions executable by the processor 504. The processor 504 is communicatively coupled with the optical detection unit 502 to receive the light command signals. In an aspects, processing of the commands by performing analysis of the received modulated light may be implemented with processor 504 including a low SWaP Raspberry Pi module. Additionally, the processor 504 may include a BitScope Micro, which is one of the smallest mixed signal scopes that can serve as an oscilloscope, logic analyzer, waveform generator, and spectrum analyzer. In one embodiment, the UAV 500 may utilizes individualized photodiodes and the BitScope. In an alternate embodiment, the device will include an integrated photodiode array dome with an embedded microcontroller (not shown). The microcontroller programing can be ported in from the code used to detect the BitScope Micro.

Additionally, the UAV 500 may include an integrated camera device 508, which is typical for many UAVs. Once the UAV 500 has received the signal or found its intended target using the omnidirectional dome array, the device may utilize the camera 508 for fine tracking and terminal target solution. This may be accomplished via a suite of low power target tracker algorithms, such as Histogram of Oriented Gradients (HOG), edge detectors, and frame averaging. Since the camera 508 only needs to track an appropriately blinking signal, the tracker and detection algorithm do not need to be very sophisticated in the physical (X-Y) space. That is, machine learning or other complex trackers may not be needed. Once the target (e.g., a modulated or blinking light) is found, a temporal code is counted to re-confirm the target or message. The message is sent to the drone's flight computer (which may be implemented within processor 504 or via a separate processor), while a controlling loop guides the drone onto its target. As is known, existing low cost UAVs include built-in onboard person tracking software that allows the UAV to follow and keep a subject in the center FOV of its camera. A similar algorithm may be employed here to instruct or fly the UAV. A UAV compatible with one of the popular open-source flight controls, such as Px4 or Dronecode, enables a flight control and image processing algorithm to be used.

In other aspects, it is noted that the light signal commands can be sent directly to the UAV or can be "shined/painted" onto some object in the field of view of the UAV such that the UAV can detect and received reflected signals. The combination of both the camera 508 and the optical detection unit 502 (e.g., photodiode array) will increase the probability of the UAV will receive the modulated code regardless of orientation to the user. In either scenario, a line of sight of the UAV to the source control unit or to the reflection of the modulated light signals off some object will be required.

In yet further aspects, in order to avoid instances where the modulated or pulsed light beam commands are missed because the frame rate of the camera is too slow, an abroad area photodiode may be implemented in unit 502 to receive the initial signal. These low-cost photodiodes regularly have response times in the nanosecond range. Pointing and final delivery may be still determined by the camera 508 once the higher-speed signal is interrupted.

Figure 6:
FIG. 6 shows an example input image as viewed from a UAV visible camera.

FIG. 6 shows an example input image as viewed from a UAV visible camera (e.g., a visible light portion of camera 508). Such images, however, may be better utilized if filtered to decrease superfluous background information. Accordingly, the UAV 500 may also benefit from inclusion of a filtering unit 510 as further illustrated in FIG. 5. In some aspects, the filtering unit 510 may implement both high pass filtering to remove lower wavelengths (i.e., higher light frequencies), as well as laser line notch filtering, to pass or detect certain light frequencies, such as those utilized by the laser control unit (e.g., 102, 302, or 400).

Figure 7A:
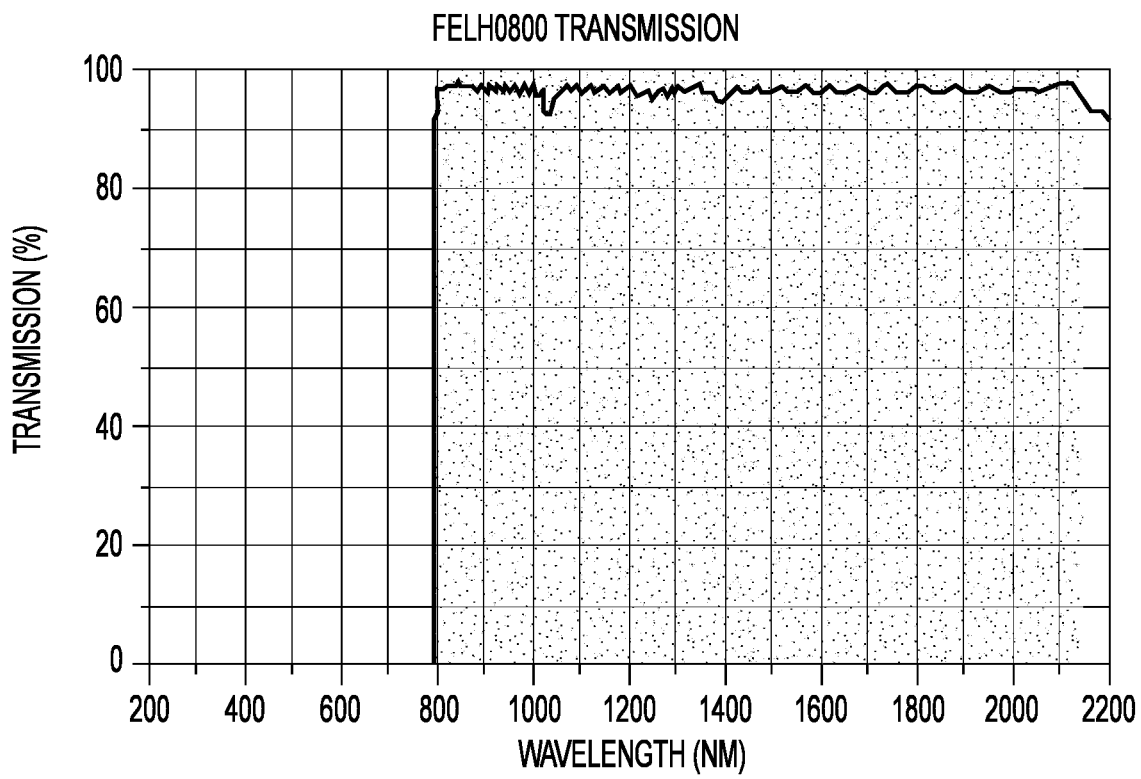
FIG. 7A shows a plot of a high pass filter enabling optical filtering of a scene to remove unwanted background light.
Figure 7B:
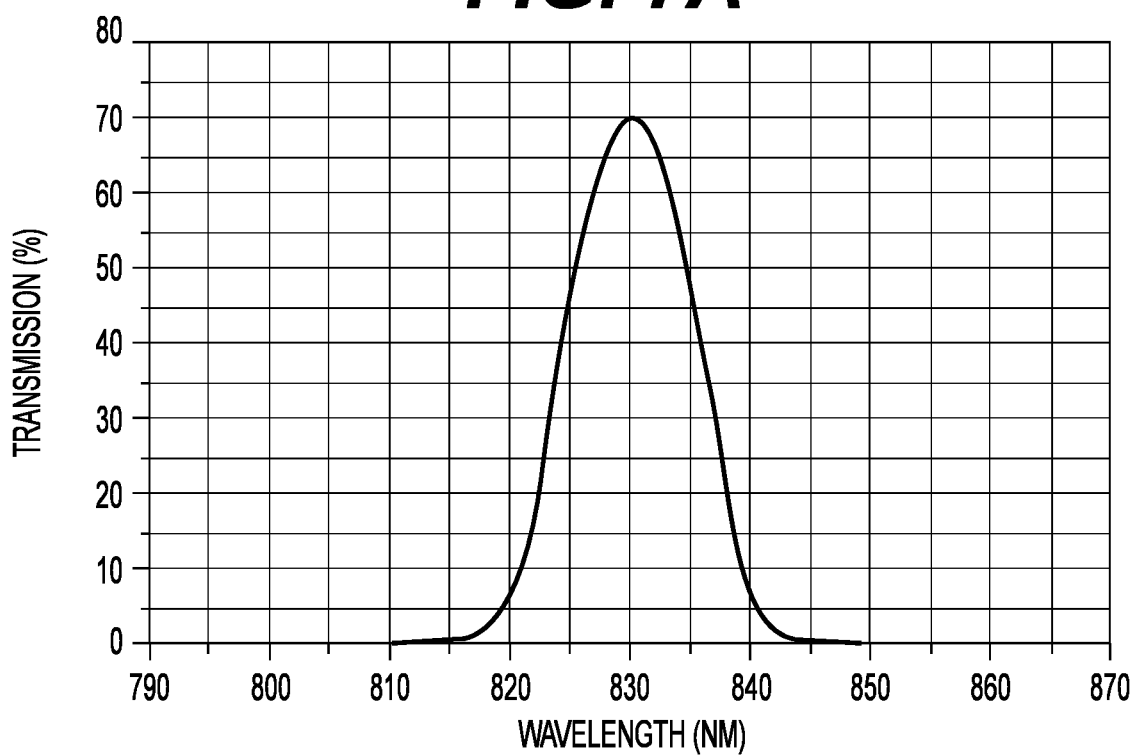
FIG. 7B shows a plot of a notch filter enabling optical filtering of a scene to remove unwanted background light.

FIGS. 7A and 7B illustrate exemplary plots of high pass filtering and notch filtering respectively. It is noted that these spectral profiles are non-limiting and exemplary only. As may be seen in FIG. 7A, light wavelengths below approximately 880 nanometers are blocked, with transmission only occurring for wavelengths greater than this (i.e., for light frequencies equal to or less than the frequency corresponding to 800 nm). FIG. 7B illustrates a notch or band pass filter where light centered at approximately the 830 nm wavelength is passed through the filter, which may correspond to the frequency of the laser light used for control of the UAV.

Figure 8:
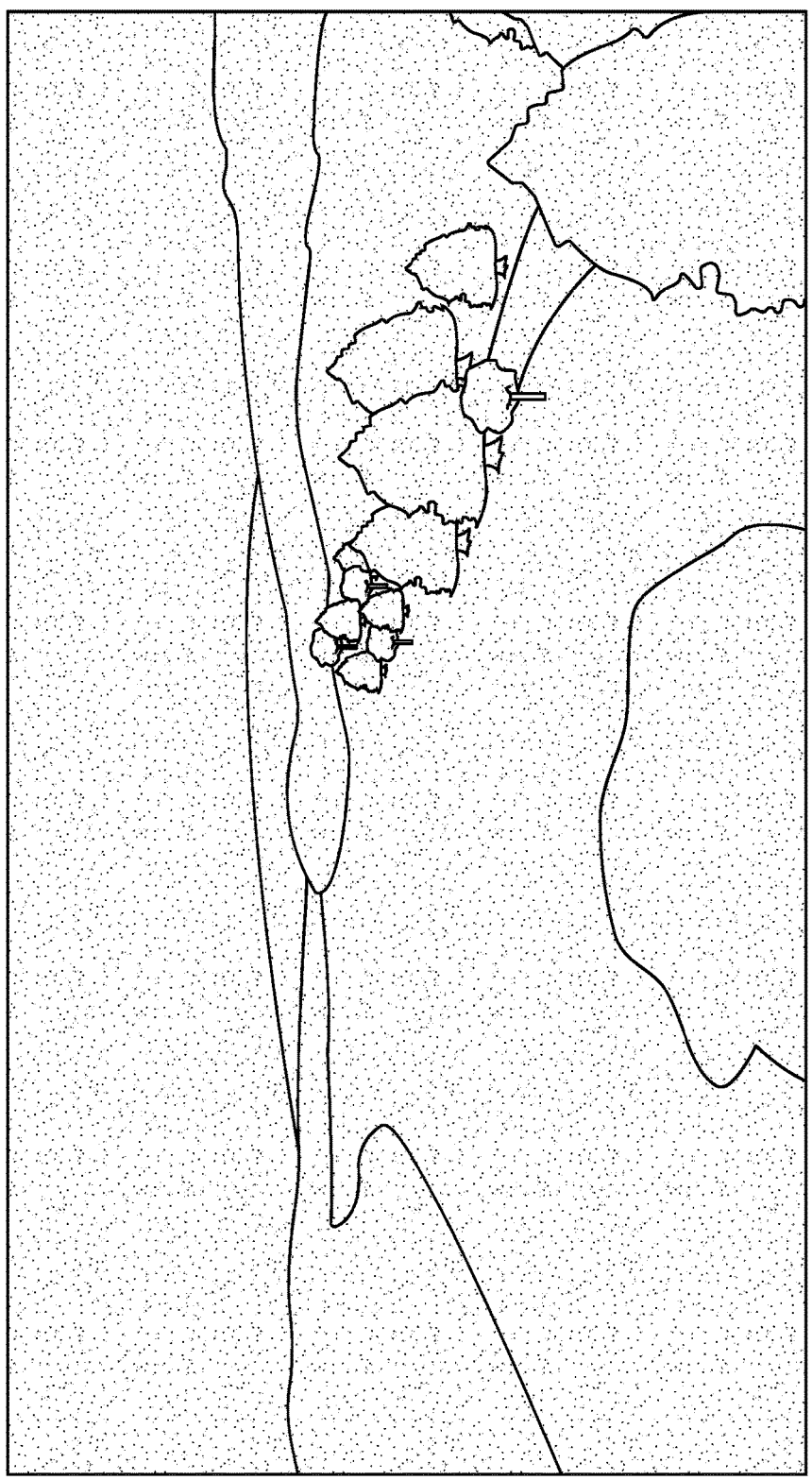
FIG. 8 shows an optically filtered scene of the scene of FIG. 6 that has decreased background in the filtered bands.

FIG. 8 shows an example of an optically filtered scene 800 that looks dimmer due to decreased background in the filtered bands. Combining the filters in FIGS. 7A and 7B makes the scene look like FIG. 8 to the camera, where only the most relevant information is permitted to get through to the camera and the detector. This combination is important because it ignores all the extraneous information that slows down the processing of the image. This filtering allows operational availability during day, night, and other mild weather patterns including light rain and dust. Day is much harder to send optical signals to cameras and detectors because of the sun. Accordingly, the present design mitigates the sun and ensures the lasers are the dominant signal source. This filtered approach of the image enables command and control of large swarms with no RF communications.

The system may further utilize two signaling and control methods, each with their own purposes and optimization considerations. One includes a camera optimized for SWaP and for the mission set to "begin" engaging small man sized targets at a range of 100 meters. The other includes a detector with a narrow field of view (shown at 512 in FIG. 5), which leverages the aligning capability of the camera 508. The camera 508 is responsible for orientation and terminal guidance. Any distance shorter than 100 meters is easier to engage and while distance greater than 100 meters are still very able to be engaged, the accuracy factors of the users dominate the error considerations. The detector 512 with a narrow field of view is responsible for signals interpretation. The camera 508 and detector 512 may be bore sighted to have the same optical axis, which weakly converge at a distance of twice the threshold engagement range, which may be approximately 200 meters. The detector 512 is responsible for confirming signals because it has a readout rate which is nearly real-time, whereas the camera 508 can only receive signals at a rate of half its refresh rate. That is, a 60 Hertz refresh rate signal, for example, can only receive a maximum of 30 bits of data per second. This is because the readout rate of the camera 508 integrates over a fixed time frame and then reads out that entire frame.

The detector and the dropped camera frame is a point of available use. Since the presently disclosed system operates the deployment and control of the UAVs, it is preferable to synchronize their clocks with the control unit's clock. That way during the dropped frame (30 times a second, or once every 10 inches of drone travel when traveling at 20 mph) the system reasserts continual control over the UAV via the detector (e.g., 512). The system sends a temporally modulated sine wave on the laser carrier wavelength of 830 nm for simple commands (move, search, attack, disarm, and return) and on top of that temporal frequency the system may then further modulate hard digital identification codes.

Figure 9:
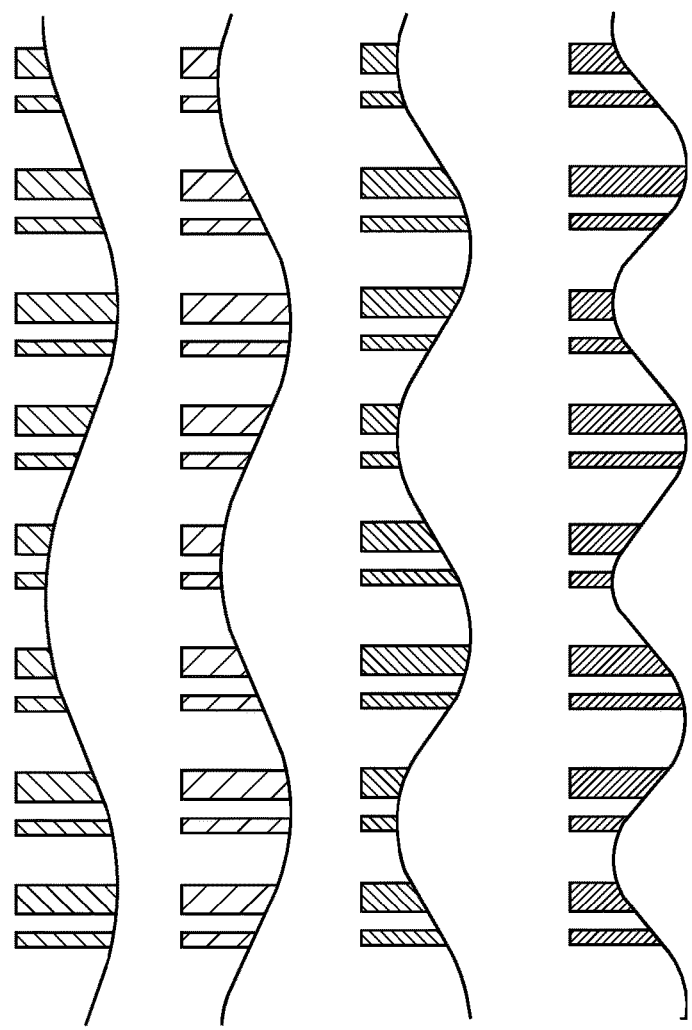
FIG. 9 illustrates an example of laser light carrier waves with modulated codes usable with the control unit.

FIG. 9 illustrates examples 900 of modulation of digital identification codes on top of a carrier frequency. In the examples of FIG. 9, the system modulates a 0101100 on top of the carrier, which may be in the MHz range, but not limited to such. Note that the length of the identification code is several digits longer than the code that is used for the camera. In one embodiment, the system uses two codes per drone: One code is for orientation and one is for security and mission certainty. The temporal modulation is picked off by the detector and sent through a simple filter to minimize electronics SWaP. 30 frames of the 60 Hz camera, for example, are used to keep the laser in the center of the field of view for the detector to read and is specific to just that drone. The other 30 frames are for maintaining real-time continuous control over the drone when in use. An inverse of this approach is to use a specific sine wave temporal frequency as the validation code and then to send large data uploads to the drone for other purposes.

In yet a further aspect, the system may employ three broad area detectors on the bottom of the drone to enable users to point their control unit at the drone and to send it commands; primarily the move and search commands. The move command means to direct a drone to go to the location it sees the laser signal at and to orient that location just slightly ahead but below the drone. The search command is a covert way to tell the drone, "You're looking in the wrong direction, look around for my ordered point of focus." The camera (e.g., camera 508) has an approximate field of view (FOV) between 120-180 degrees per configuration and purpose. The system may use that FOV dependent upon when it received the last command and what that last command was.

Figure 10:
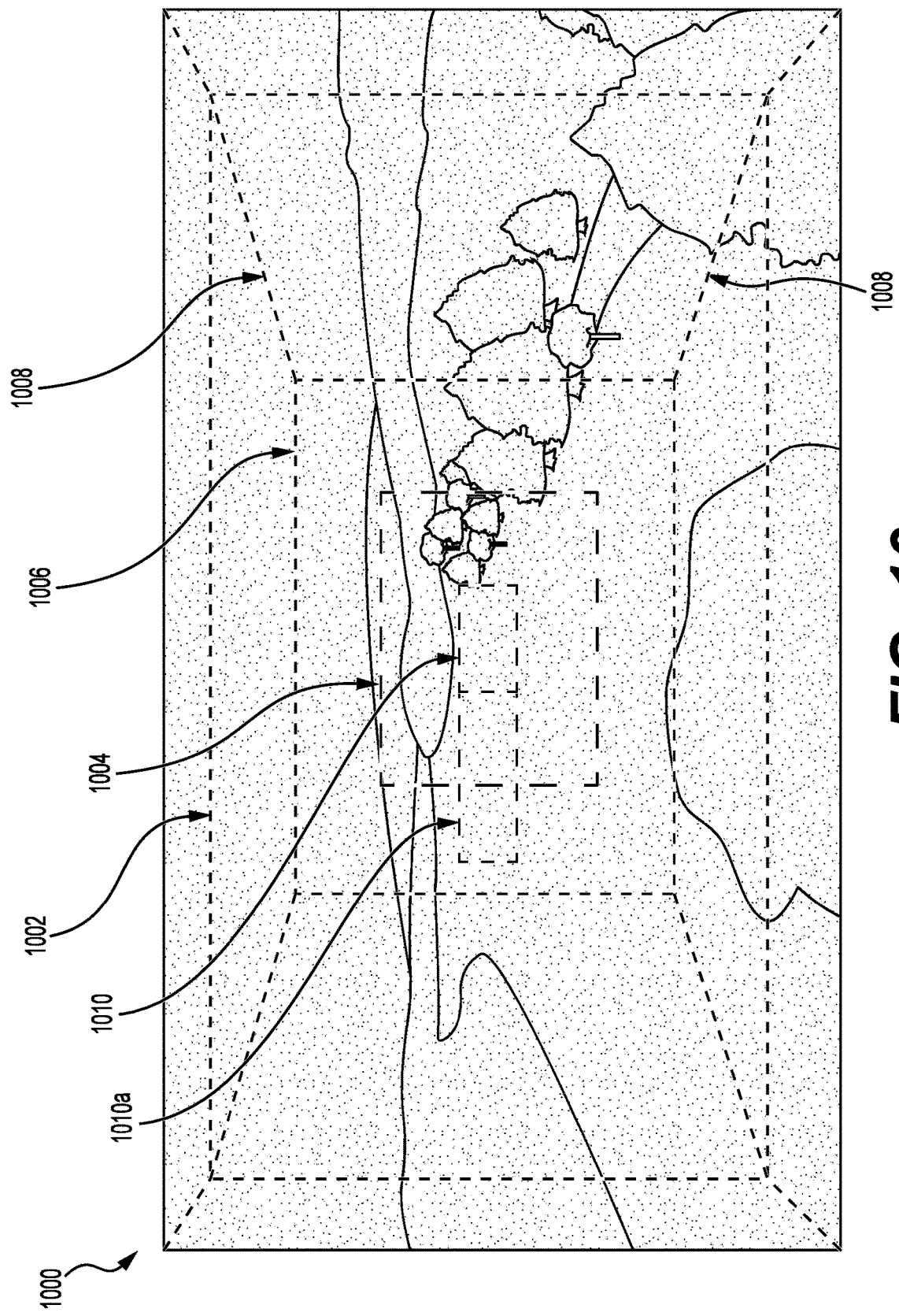
FIG. 10 shows an entire camera field of view (FOV) with processing localized FOV.

FIG. 10, as an example, illustrates an exemplary view 1000 based on the example of FIG. 8 that illustrates various FOVs that may be implemented. For general loitering, the system may be configured to process the entire FOV, which is the outline 1002. Once oriented, the system may, in turn, processes only a small area box shown at 1004. While waiting, the system processes progressively larger areas of the FOV for the signal, moving boxes 1002 or 1006 connected by lines 1008. On attack, the system processes only the most relevant portion of the FOV (box 1004, then box 1010, and finally a wide box 1010a). The processing algorithms may employ standard averaging and centroid mapping algorithms. On the last few feet from target, a proximity sensor can be used to enable a package carried by the UAV to perform its intended purpose: e.g., explode, fire a shot, launch something, drop something, etc.

In yet a further aspect, the system may use on board detectors with LEDs (e.g., 514 in FIG. 5) for multiple drone swarm communication and object avoidance using only optical light. In this configuration, light is sent through the gaps in between the prop blades to establish a precise beat frequency of the drone. The on-board detectors will look for when that signal amplitude rises above a set threshold, meaning it is reflecting off something nearby. Rather than establishing levels of urgency, it compares the signals from both sides of the drone to one another and sends a simple command: move away until phase difference is below threshold or until balanced. This algorithm is approximately how schools of fish avoid each other and has incredibly low power overhead as it relies on simple low frequency op amps to determine proximity and transistors to send signal once above threshold. It is important to only send signal when something can be done to avoid an object and to not send a signal when movement is not possible in that direction anyway. An exemplary decision table for this algorithm is illustrated in FIG. 11.

It is noted that the presently disclosed system can be used in a variety of ways. A primary application is sending commands by changing the frequency of light such as by allowing a user to press a button on the rifle grip for UAV control in an RF communications denied environment. Additionally, drones are subjected to interference when similar radio frequencies are being broadcasted within the area, and the present system may be beneficial in such instances. Commercially this system can be used control commercial drones to assist in the delivery of many objects, such as for package deliveries. The present system could also be beneficially implemented in cities where RF is far too congested.

Although the invention has been described in detail with reference to certain preferred embodiments, variations and modifications exist within the spirit and scope of the invention as described and defined in the following claims.

The invention claimed is:

1. A system for control of an unmanned aerial vehicle (UAV), comprising:

one or more laser light sources configured to generate at least a first beam and a second beam of laser light, wherein at least the first beam comprises a near infrared (NIR) beam and the first and second beams are capable of being aimed by a user of the system at a target of interest for the UAV; and a control unit including a modulation unit configured to:
selectively modulate at least the first beam of laser light according to at least one of one or more light frequencies or light pulses to generate one or more light control signals configured for controlling a UAV; and
transmit the one or more generated light control signals to enable the UAV to detect and receive the one or more generated light control signals.

2. The system of claim 1, wherein the control unit is within a hand control unit including one or more user input devices to select commands for controlling the UAV.

3. The system of claim 2, wherein the hand control unit includes a firearm grip.

4. The system of claim 3, wherein the firearm grip is a rifle fore-grip.

5. The system of claim 1, wherein the modulation unit is further configured to modulate the first beam of laser light according to the one or more light frequencies, wherein each of the one or more light frequencies is configured to correspond to a respective light control signal for the UAV.

6. The system of claim 1, wherein at least one of the one or more laser light sources is external to the control unit.

7. The system of claim 1, wherein the UAV comprises:
an optical detection unit configured for receiving and detecting the one or more generated light control signals; and
a camera device.

8. The system of claim 7, wherein the optical detection unit comprises an array of optical detectors configured to detect approximately 2π steradians of view from a bottom portion of the UAV.

9. The system of claim 7, wherein the UAV further comprises a narrow field of view detector configured to interface with the camera device and perform signal interpretation of images detected by the camera.

10. A system for control of an unmanned aerial vehicle (UAV), comprising:
a laser light source configured to generate at least one beam of laser light; and
a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
wherein the laser light source is integrated within the control unit.

11. A system for control of an unmanned aerial vehicle (UAV), comprising:
a laser light source configured to generate at least one beam of laser light; and
a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
wherein the modulation unit is configured as one of a liquid crystal, an electro chromic window, or an electro optic phase retarder that is configured to control an on/off frequency of the at least one beam of laser light or create pulses of the at least one beam of laser light.

12. A system for control of an unmanned aerial vehicle (UAV), comprising:
a laser light source configured to generate at least one beam of laser light; and
a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
wherein the modulation unit is configured to be selectively engageable with the at least one beam of laser light generated by the laser light source.

13. The system of claim 12, wherein the hand control unit includes a firearm grip.

14. The system of claim 13, wherein the firearm grip is a rifle fore-grip.

15. A system for control of an unmanned aerial vehicle (UAV), comprising:
a laser light source configured to generate at least one beam of laser light; and
a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
wherein the modulation unit is configured to modulate one or more codes configured for the UAV including a first code configured for orientation by the UAV and second code for security.

16. A system for control of an unmanned aerial vehicle (UAV), comprising:
a laser light source configured to generate at least one beam of laser light; and
a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
wherein the UAV comprises:
an optical detection unit configured for receiving and detecting the one or more generated light control signals;
a camera device; and
at least one filtering unit configured to filter select frequencies of light from images detected by the camera device.

17. A system for control of an unmanned aerial vehicle (UAV), comprising:
a laser light source configured to generate at least one beam of laser light; and a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
wherein the UAV comprises:
an optical detection unit configured for receiving and detecting the one or more generated light control signals;
a camera device; and
a processor and one or more light emitting diodes, wherein the processor is configured to implement an avoidance method using the light emitting diodes to detect proximity to objects including other UAVs in a swarm of UAVs.

18. A system for control of an unmanned aerial vehicle (UAV), comprising:
a laser light source configured to generate at least one beam of laser light; and
a control unit including a modulation unit configured to:
modulate the at least one beam of laser light according to at least one of one or more light frequencies or light pulses to generate one or more light control signals configured for controlling a UAV; and
transmit the one or more generated light control signals to enable the UAV to detect and receive the one or more generated light control signals;
an optical detection unit within the UAV that is configured to receive and detect the one or more generated light control signals;
a camera device in the UAV;
at least one filtering unit configured to filter select frequencies of light from images detected by the camera device;
a narrow field of view detector configured to interface with the camera device and perform signal interpretation of the images detected by the camera device; and
a processor within the UAV that is communicatively coupled with the optical detection unit, camera device, and narrow field of view detector and configured to control operation of the UAV in response to the detected one or more generated light control signals, and the signal interpretation of the images detected by the camera as processed by the narrow field of view detector.

* * * * *